(12) United States Patent
Endo

(10) Patent No.: US 11,268,986 B2
(45) Date of Patent: Mar. 8, 2022

(54) CURRENT MEASURING DEVICE

(71) Applicant: KOA CORPORATION, Ina (JP)

(72) Inventor: Tamotsu Endo, Nagano (JP)

(73) Assignee: KOA CORPORATION, Nagano (JP)

( * ) Notice: Subject to any disclaimer, the term of this patent is extended or adjusted under 35 U.S.C. 154(b) by 430 days.

(21) Appl. No.: 16/334,494

(22) PCT Filed: Aug. 17, 2017

(86) PCT No.: PCT/JP2017/029500
§ 371 (c)(1),
(2) Date: Mar. 19, 2019

(87) PCT Pub. No.: WO2018/055958
PCT Pub. Date: Mar. 29, 2018

(65) Prior Publication Data
US 2021/0293854 A1    Sep. 23, 2021

(30) Foreign Application Priority Data

Sep. 20, 2016 (JP) .............................. JP2016-183220

(51) Int. Cl.
*G01R 15/14* (2006.01)
*G01R 19/32* (2006.01)

(52) U.S. Cl.
CPC ........... *G01R 15/146* (2013.01); *G01R 19/32* (2013.01)

(58) Field of Classification Search
None
See application file for complete search history.

(56) References Cited

U.S. PATENT DOCUMENTS

| 2009/0039836 | A1 | 2/2009 | Asada | |
|---|---|---|---|---|
| 2011/0241649 | A1* | 10/2011 | Ozawa | G01R 31/364 |
| | | | | 324/76.11 |
| 2012/0161753 | A1* | 6/2012 | Kumazawa | G01R 11/04 |
| | | | | 324/156 |
| 2014/0125429 | A1* | 5/2014 | Yoshioka | G01R 1/203 |
| | | | | 333/172 |
| 2014/0320150 | A1* | 10/2014 | Sato | G01R 35/005 |
| | | | | 324/601 |

FOREIGN PATENT DOCUMENTS

| JP | 2009-40314 A | 2/2009 |
|---|---|---|
| JP | 2009-63527 A | 3/2009 |
| JP | 2010-236980 A | 10/2010 |
| JP | 2013-124859 A | 6/2013 |
| JP | 2013-174555 A | 9/2013 |
| JP | 2015-17832 A | 1/2015 |
| KR | 20-2009-0000596 U | 1/2009 |
| WO | WO2013/015219 A1 | 1/2013 |

* cited by examiner

*Primary Examiner* — Jas A Sanghera
(74) *Attorney, Agent, or Firm* — Crowell & Moring LLP

(57) ABSTRACT

Provided is a current measuring device for measuring current, including a conductor (1) adapted to pass current therethrough, and a circuit board (31) with a wire, the wire being adapted to extract a voltage signal from the conductor, in which the circuit board is disposed upright with respect to the conductor.

6 Claims, 5 Drawing Sheets

CURRENT MEASURING DEVICE

This application is a 371 application of PCT/JP2017/029500 having an international filing date of Aug. 17, 2017, which claims priority to JP2016-183220 filed Sep. 20, 2016, the entire content of each of which is incorporated herein by reference.

TECHNICAL FIELD

The present invention relates to a current measuring device.

BACKGROUND ART

Patent Literature 1, for example, describes a structure in which a shunt resistor and a circuit board incorporating a temperature sensing circuit are disposed inside a case. Such a structure can sense the amount of current flowing through a battery (i.e., cells) so as to sense the state of charge of the battery.

CITATION LIST

Patent Literature

Patent Literature 1: JP 2013-174555 A

SUMMARY OF INVENTION

Technical Problem

There may be cases where one wants to mount electronic components, such as a microcomputer and an amplifier, for processing sensed signals on the aforementioned circuit board incorporating the temperature sensing circuit, for example.

However, the conventional structure has a problem in that mounting electronic components on the circuit board results in an increased overall size of the device.

It is an object of the present invention to reduce the size of a current measuring device. It is another object of the present invention to increase the mountability of electronic components on the current measuring device.

Solution to Problem

According to an aspect of the present invention, there is provided a current measuring device for measuring current, including a conductor adapted to pass current therethrough, and a circuit board with a wire, the wire being adapted to extract a voltage signal from the conductor, in which the circuit board is disposed upright with respect to the conductor.

The circuit board and the conductor are preferably arranged such that their length directions become parallel. Then, the circuit board can be disposed within the width of the conductor (i.e., a shunt resistor) as viewed in plan view, and thus, the current measuring device can be mounted in a small space or a narrow portion.

The circuit board may be disposed within a plane of the conductor. Accordingly, the mount area occupied by the current measuring device can be reduced.

Preferably, the circuit board has electronic components mounted thereon, and the electronic components are disposed away from the conductor. Accordingly, the influence of heat on the electronic components can be mitigated.

Preferably, among the electronic components, a temperature sensing element is disposed near the conductor, and an electronic component for processing a sensed signal from the temperature sensing element is disposed at a position more distant from the conductor than is the temperature sensing element.

Further, the current measuring device of the present invention includes a case that houses the circuit board.

The depth of a housing space of the case is preferably equal to the length of the circuit board. Accordingly, the mount area occupied by the current measuring device can be reduced.

The present specification incorporates the disclosure of JP Patent Application No. 2016-183220 that forms the basis of the priority claim of the present application.

Advantageous Effects of Invention

According to the present invention, the size of a current measuring device can be reduced. In addition, the mountability of electronic components on the current measuring device can be increased.

DESCRIPTION OF EMBODIMENTS

Hereinafter, a current measuring device in accordance with an embodiment of the present invention will be specifically described based on an example in which the device is formed using a resistor with a butt-joint structure that is obtained by butt-joining end faces of a resistive element and electrodes (i.e., terminal portions), with reference to the accompanying drawings. It should be noted that the resistor may also have a structure in which a resistive element and electrodes are connected on their surfaces. A resistor and a circuit board shall be collectively referred to as a "body." Attaching the body to a case can form a current measuring device.

In this specification, a direction in which an electrode, a resistive element, and another electrode of a resistor are arranged in this order shall be referred to as a "lengthwise direction," and a direction crossing the lengthwise direction shall be referred to as a "width direction." In addition, a direction perpendicular to the plane of the resistor shall be referred to as a "perpendicular direction." Directions concerning the circuit board and the like shall be defined in a similar manner.

First, a current measuring device in accordance with a first embodiment of the present invention will be described.

Figure 1:
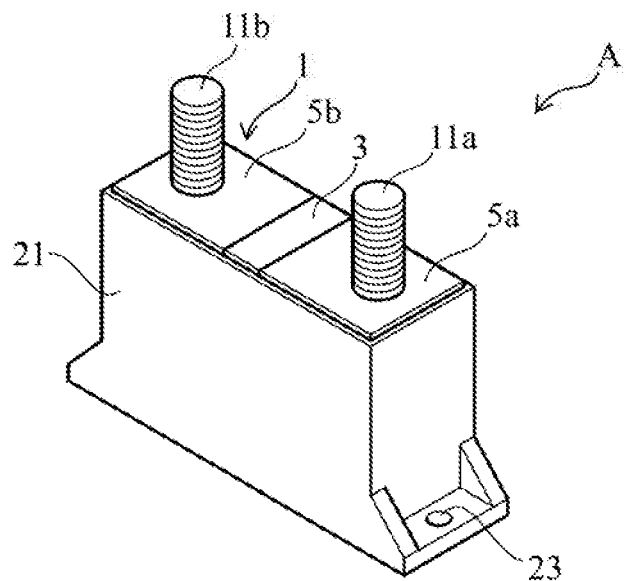
FIG. 1 is a perspective view of an exemplary configuration of the appearance of a current measuring device in accordance with a first embodiment of the present invention.
Figure 2:
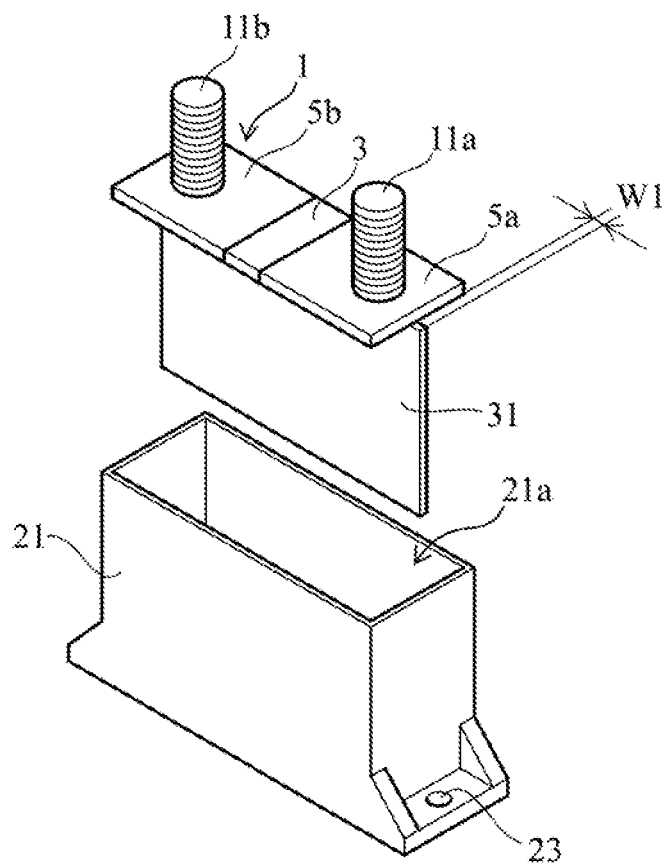
FIG. 2 is a perspective view of an exemplary configuration of the appearance of the current measuring device in FIG. 1 when the body is detached from the case.

FIG. 1 is a perspective view of an exemplary configuration of the appearance of a current measuring device in accordance with this embodiment. FIG. 2 is a perspective view of an exemplary configuration of the appearance of the current measuring device in FIG. 1 when the body is detached from the case.

As illustrated in FIGS. 1 and 2, a current measuring device A in accordance with this embodiment has a structure in which a bottom face of a shunt resistor 1 fixedly covers an opening 21a of an upper portion of a case 21. The shunt resistor 1 includes a resistive element 3 and first and second electrodes (i.e., a pair of terminal portions) 5a and 5b provided on opposite sides thereof. A circuit board 31 described below has wires for extracting a voltage signal from the shunt resistor 1.

The case 21 and the shunt resistor 1 are fixed together by, for example, forming through-holes in part of the first and second electrodes 5a and 5b and fastening the shunt resistor 1 to the case 21 with screws and the like, but any other structures can be used.

The shunt resistor 1 is a butt-joint structure obtained by butt-joining end faces of the resistive element 3 and the first and the second electrodes 5a and 5b, for example. For the resistive element 3, a resistive material, such as a Cu—Ni, Ni—Cr, or Cu—Mn-based material can be used. For the first and second electrodes 5a and 5b, a material such as Cu can be used. The joined portions of the resistive element 3 and the first and second electrodes 5a and 5b can be formed using electron beam welding, laser beam welding, cladding, or brazing with metallic nano paste, for example.

The first and second electrodes 5a and 5b have arranged thereon bolts 11a and 11b, respectively, for example, that protrude in a perpendicular direction, specifically, a direction opposite to a direction in which circuit board 31 is disposed in an upright position.

The dimension of the shunt resistor 1 in the length direction is shorter than that of the circuit board 31 by W1 at each end. Accordingly, the possibility of damage to each end of the shunt resistor 1 can be reduced when the body is housed in the case 21.

It should be noted that the shunt resistor 1 may also be formed using a conductor without the resistive element 3, for example, a bus bar made only of copper.

In addition, besides the bolts 11a and 11b, fasteners such as nuts combined with the bolts can also be used, for example.

As illustrated in FIG. 2, the circuit board 31 forms the body by being disposed upright in the perpendicular direction with respect to the shunt resistor 1, for example. Moving the shunt resistor 1 such that the circuit board 31 passes through the opening 21a can allow the opening 21a to be covered with the bottom face of the shunt resistor 1 and also allow the circuit board 31 to be housed in the case 21.

The case 21 has the shape of a rectangular parallelepiped, for example, and has the opening 21a in its upper portion and also has a housing space capable of housing the body. When the depth of the housing space of the case 21 in the direction in which the circuit board 31 is inserted is designed equal to the length of the circuit board 31 in its insertion direction, the mount area occupied by the current measuring device A can be reduced.

Although the opening 21a is provided in the upper portion in the example illustrated herein, a structure is also possible in which an opening is provided in a side face of the case 21, and the circuit board 31 is inserted through the opening so that the opening in the side face is covered with a cap.

The circuit board 31 and the shunt resistor 1 are arranged such that their length directions become parallel. Therefore, the circuit board 31 can be disposed within the width of the shunt resistor 1 as viewed in plan view, and thus, the current measuring device can be mounted in a small space or a narrow portion.

The case can have any shape depending on a device used or a place in which the device is disposed.

For example, if a groove adapted to receive the lower end of the circuit board 31 is formed at the bottom of the case 21 on a side opposite to the opening 21a of the case 21, the case 21 and the body can be firmly fixed together at the lower end of the circuit board 31.

Reference numeral 23 denotes a hole through which a fastener, such as a bolt (not illustrated), is adapted to be inserted. The current measuring device A can be fastened to a housing of a battery or the like through the hole 23.

The aforementioned current measuring device A senses the amount of current flowing through a battery (i.e., cells), for example, so as to sense the state of charge of the battery. The shunt resistor 1 includes the first and second electrodes 5a and 5b adapted to be connected to current paths so that current to be measured flows through the first and second electrodes 5a and 5b, and generates a potential difference in accordance with changes in the amount of current. Then, the state of the battery is sensed from a voltage drop generated in the shunt resistor 1.

Figure 3:
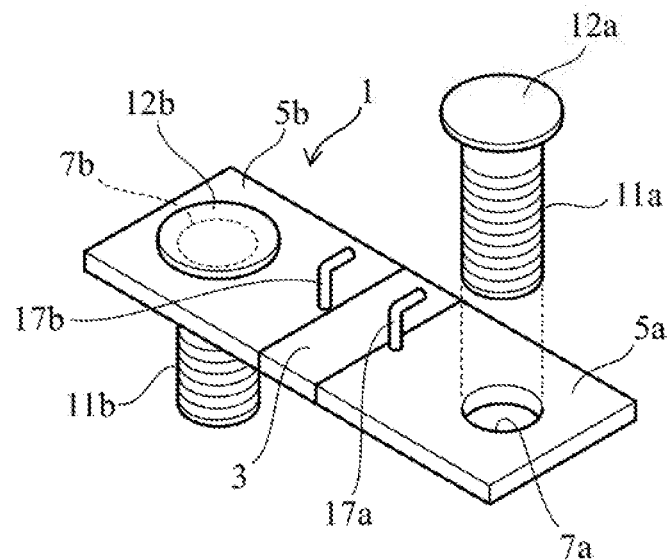
FIG. 3 is a perspective view of an exemplary detailed configuration of a shunt resistor.

FIG. 3 is a perspective view of an exemplary detailed configuration of the shunt resistor 1.

The first and second electrodes 5a and 5b have holes 7a and 7b formed therein, respectively. The bolts 11a and 11b that are separate members are inserted through the holes 7a and 7b, and flanges of heads 12a and 12b of the bolts 11a and 11b abut the outer peripheral edges of the holes 7a and 7b, respectively. The bolts 11a and 11b can be fixed to the shunt resistor 1 using press fit or welding, for example.

The shunt resistor 1 in accordance with this embodiment has arranged thereon voltage sensing terminals 17a and 17b that rise from the plate-shaped first and second electrodes 5a and 5b, respectively. In this example, the voltage sensing terminals 17a and 17b are formed upright on the first and second electrodes 5a and 5b, respectively, at positions in proximity to the resistive element 3 and at positions close to respective boundaries between the resistive element 3 and the first and second electrodes 5a and 5b. As illustrated in FIG. 3, each of the voltage sensing terminals 17a and 17b is shaped such that it is bent along the width direction.

Figure 4:
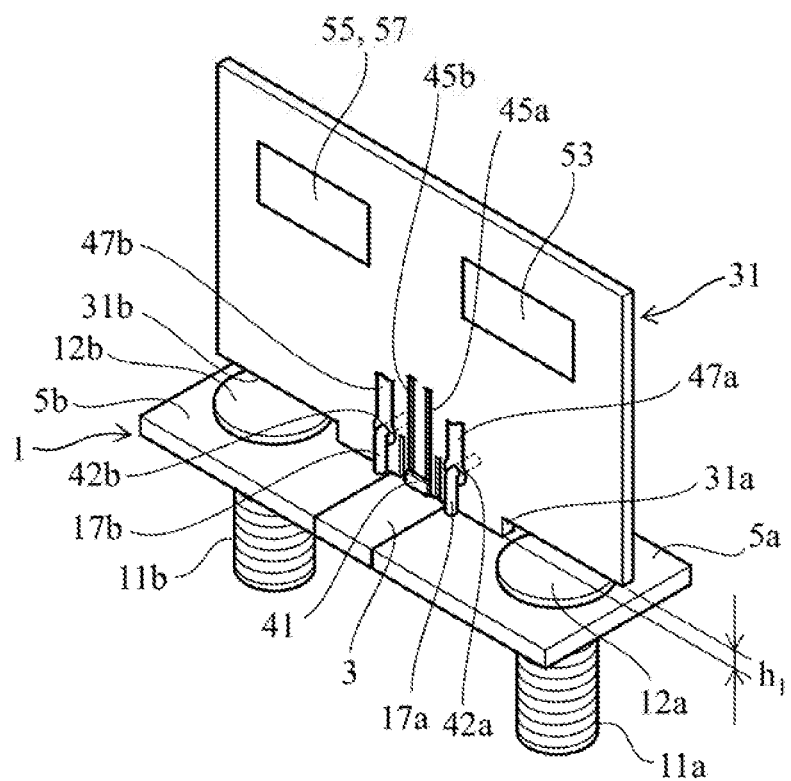
FIG. 4 is a perspective view of an exemplary detailed structure of a shunt resistor and a circuit board that are fixed together.
Figure 5:
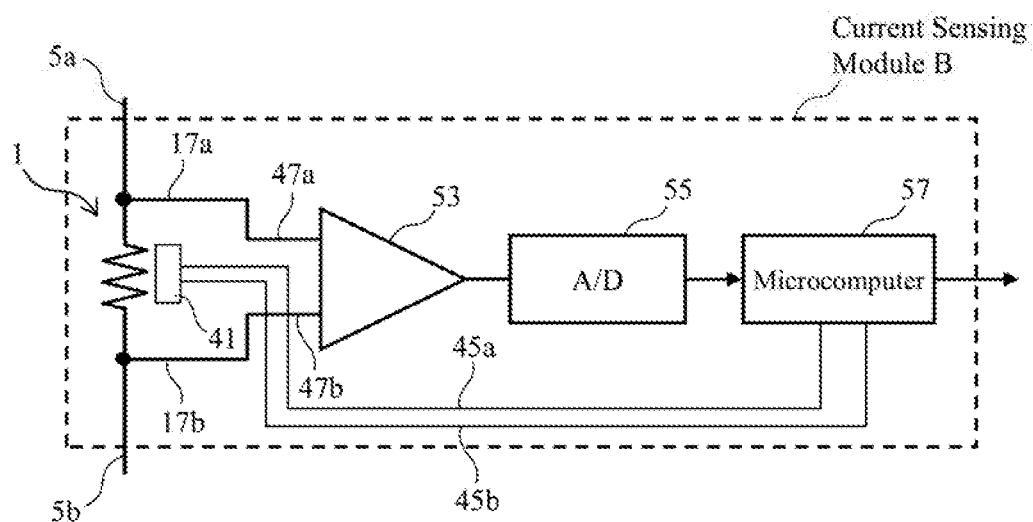
FIG. 5 is a functional block diagram of an exemplary configuration of a current sensing device (i.e., a current sensing module).

FIG. 4 is a perspective view of an exemplary detailed structure of the shunt resistor 1 and the circuit board 31 that are fixed together. FIG. 5 is a functional block diagram of an exemplary configuration of a current sensing device (i.e., a current sensing module B).

As illustrated in FIGS. 4 and 5, the circuit board 31 (not illustrated in FIG. 5) has mounted thereon an amplifier 53, A/D converter 55, a microcomputer 57, and the like, and includes wire patterns 45a, 45b, 47a, 47b, and the like.

Each of the voltage sensing terminals 17a and 17b of the shunt resistor 1 is bent in a hook shape such that its tip end faces one side along the width direction. The portions bent in the hook shape are inserted through respective holes 42a and 42b formed in the circuit board 31. Therefore, the voltage sensing terminals 17a and 17b and the wire patterns 47a and 47b of the circuit board 31 are reliably connected together even in a state in which the circuit board 31 is disposed in an upright position.

Further, a temperature sensing element 41 is disposed on the circuit board 31 near the resistive element 3, for example. The temperature sensing element 41 sends a temperature signal to the microcomputer 57, and the microcomputer 57 corrects a voltage signal in accordance with the temperature (performs TCR correction) so as to output an appropriate sensed current signal.

The circuit board 31 is disposed upright on the bottom face of the case 21. Thus, electronic components that are weak against heat or are susceptible to the influence of heat, such as the electronic components (53, 55, 57) like ICs, are disposed on the upper portion of the circuit board 31 so that the electronic components can be isolated from the resistive element 3 generating heat. Thus, a decrease in the current sensing accuracy due to generation of heat can be suppressed.

Other components that are insusceptible to the influence of heat are arranged on portions other than the upper portion of the circuit board 31 so that the mount area of the circuit board 31 can be effectively utilized. Further, since the width of the case 21 that is required to house the circuit board 31 can be reduced, the overall size of the current sensing device can be reduced.

It should be noted that cutouts 31a and 31b, each having a height of $h_1$, formed at opposite ends of the lower portion of the circuit board 31 are adapted to house the heads 12a and 12b of the bolts, respectively.

Next, a current sensing device in accordance with a second embodiment of the present invention will be described.

Figure 6:
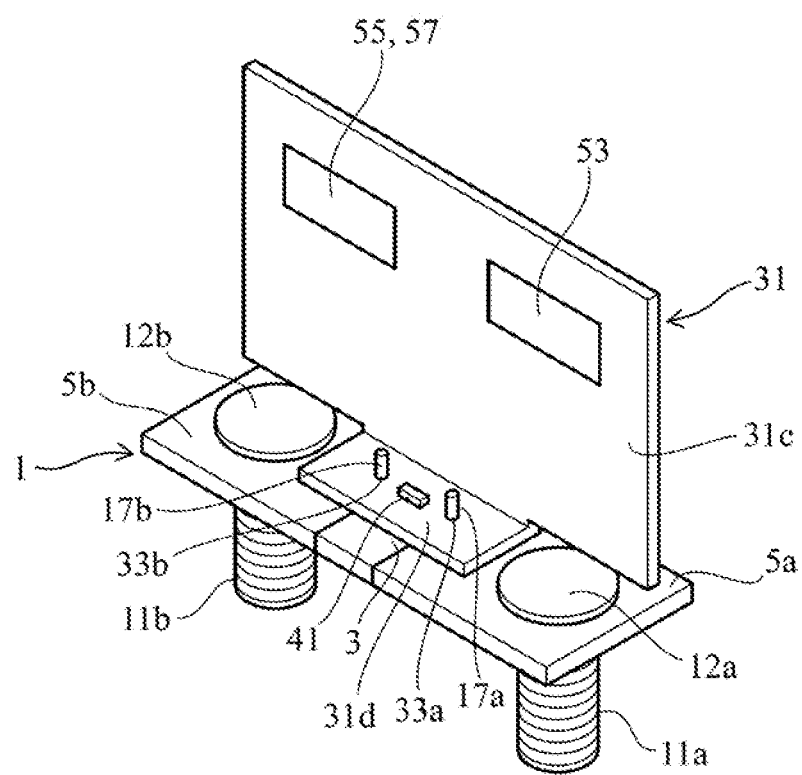
FIG. 6 is a perspective view of an exemplary configuration of the appearance of a current sensing device in accordance with a second embodiment of the present invention.

FIG. 6 is a perspective view of an exemplary configuration of the appearance of the current sensing device in accordance with this embodiment, and is a view corresponding to FIG. 4 of the first embodiment.

In the structure illustrated in FIG. 6, the shunt resistor 1 and the circuit board 31 are fixed together by part of the circuit board 31. That is, in this example, the circuit board 31 has a structure including an upright portion 31c and a bottom face portion 31d that is adapted to be disposed on the surface of the shunt resistor 1 and fix the shunt resistor 1 and the circuit board 31 together. The bottom face portion 31d is provided with holes 33a and 33b through which the voltage sensing terminal 17a, 17b of the shunt resistor 1 are adapted to be inserted, whereby the shunt resistor 1 and the circuit board 31 can be fixed together.

According to this embodiment, the voltage sensing terminals 17a and 17b need not be bent unlike in FIG. 3 of the first embodiment. Thus, there are advantages in that the bending step can be omitted and the structure can be simplified.

Next, a current sensing device in accordance with a third embodiment of the present invention will be described.

Figure 7:
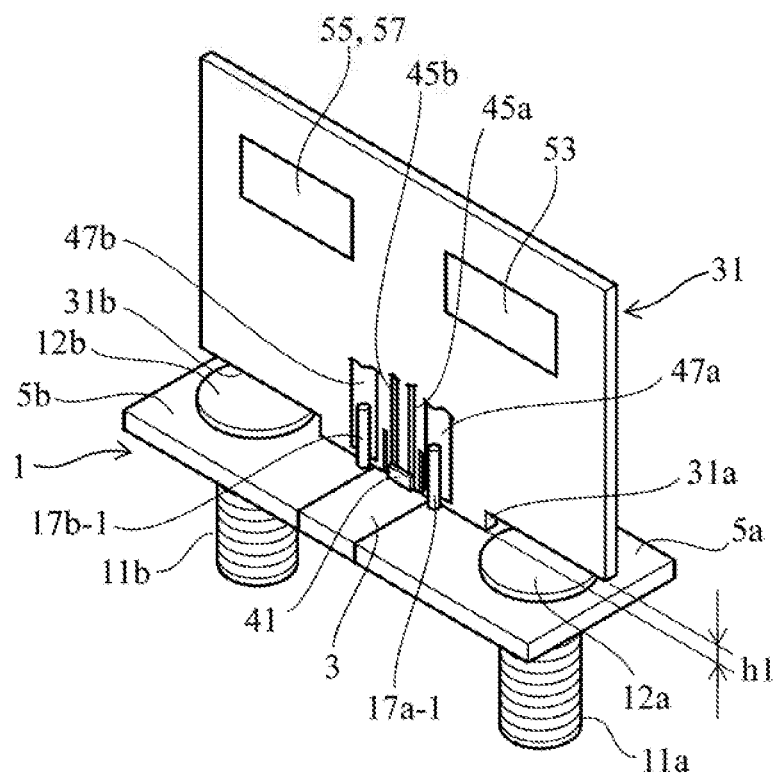
FIG. 7 is a perspective view of an exemplary configuration of the appearance of a current sensing device in accordance with a third embodiment of the present invention.

FIG. 7 is a perspective view of an exemplary configuration of the appearance of the current sensing device in accordance with this embodiment, and is a view corresponding to FIG. 4 of the first embodiment and FIG. 6 of the second embodiment.

As illustrated in FIG. 7, voltage sensing terminals 17a-1 and 17b-1 have upright structures without bent portions unlike the voltage sensing terminals 17a and 17b in FIG. 3. The voltage sensing terminals 17a-1 and 17b-1 are brought close to the surface of the circuit board 31 and are fixed to the wires 47a and 47b of the circuit board 31, respectively, using solder or the like so as to be electrically connected thereto.

According to this embodiment, the voltage sensing terminals need not be bent unlike in FIG. 3 of the first embodiment. Thus, there is an advantage in that the structure can be simplified.

Next, a current sensing device in accordance with a fourth embodiment of the present invention will be described.

The current sensing device in accordance with this embodiment has a structure in which the current measuring device in accordance with each of the first to third embodiments includes wires and connector terminals for sending signals to an external device.

Figure 8:
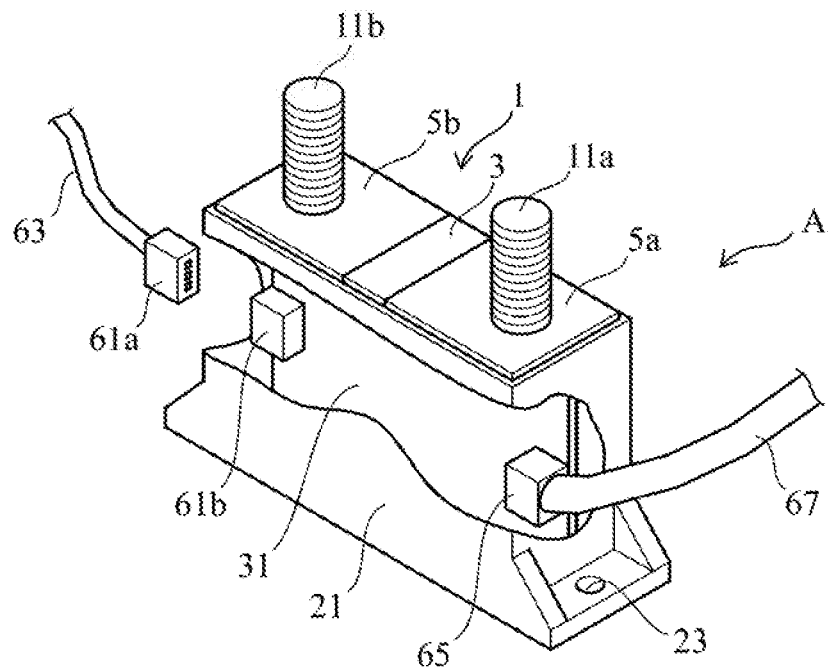
FIG. 8 is a perspective view of a current sensing device in accordance with a fourth embodiment of the present invention, in particular, an exemplary connector structure thereof.

FIG. 8 is a perspective view of an exemplary connector structure of the current sensing device in accordance with this embodiment.

The circuit board 31 includes a terminal 61a for receiving a voltage signal. Connecting a cable 63 led out from an external device to the terminal 61a can extract a voltage signal.

In addition, a terminal 65 provided on the circuit board 31 outputs a current signal as a digital signal compatible with CAN (Controller Area Network). A wire 67 is connected to the terminal 65 so that the current signal can be output to various control devices mounted on an automobile or the like.

As described above, the current sensing device in accordance with this embodiment has a terminal on the circuit board 31 for receiving a voltage signal. Therefore, there is an advantage in that signals can be easily extracted to the outside.

Next, a current sensing device in accordance with a fifth embodiment of the present invention will be described.

The current sensing device in accordance with this embodiment may be configured such that the current measuring device in accordance with each of the first to third embodiments is connected to current wires and has the following configuration.

Figure 9:
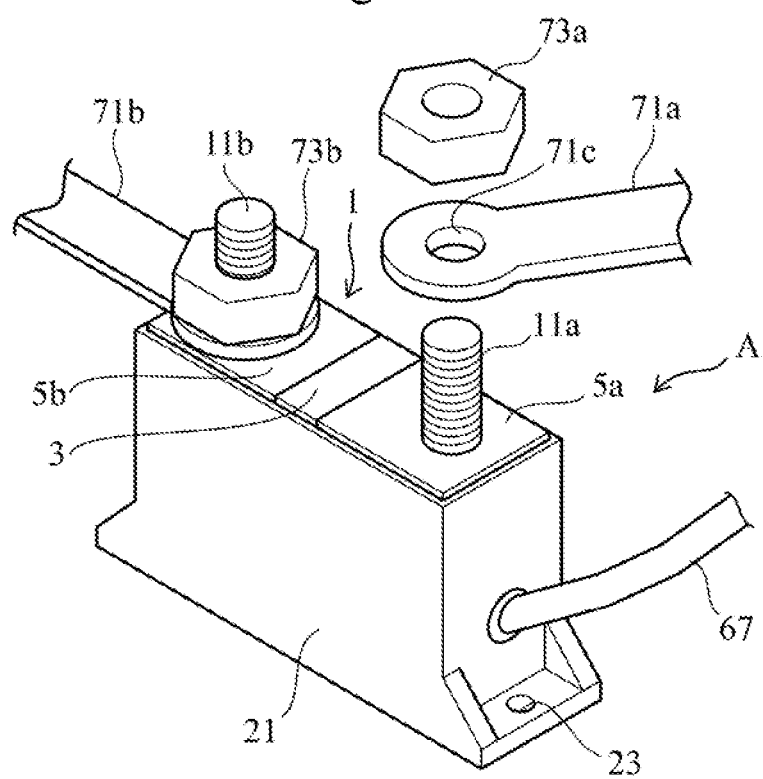
FIG. 9 is a perspective view of a fifth embodiment of the present invention, specifically, a view in which the current measuring device in accordance with each of the first to third embodiments is connected to current wires.

As illustrated in FIG. 9, terminal portions 71a and 71b, such as bus bars or cables, and the bolts 11a and 11b are connected together via nuts 73a and 73b, respectively, for example. At this time, the bus bars and the cables 71 are arranged around the bolts 11a and 11b and are securely fastened thereto with the nuts 73a and 73b.

As described above, with the bolt-nut fixation structure, the current measuring device and the current wires can be securely connected together.

Although the resistor 1 was used in the aforementioned embodiment, a bus bar may also be used instead of the resistor. That is, any conductor that can sense a potential difference may be attached to the circuit board 31. For example, a conductor, such as a bus bar, may be used instead of the shunt resistor 1.

As described above, according to the current sensing device of this embodiment, the size of the current measuring device can be reduced. Thus, the current measuring device is unlikely to become obstructive even when it is attached to a battery. Further, electronic components can be easily mounted on the current measuring device. Since the current measuring device is protected by a case, it is resistant to impacts and thus can also be attached to an automobile and the like.

In the aforementioned embodiments, the configurations and the like illustrated in the accompanying drawings are not limited thereto, and can be changed as appropriate within the range that the advantageous effects of the present invention can be exerted. Besides, the configurations and the like can be changed as appropriate without departing from the spirit and scope of the present invention.

INDUSTRIAL APPLICABILITY

The present invention is applicable to current sensing devices.

All publications, patents, and patent applications cited in this specification are incorporated by reference into this specification.

What is claimed is:

1. A current measuring device for measuring current, comprising:
   a planar conductor adapted to pass current therethrough to measure the current, the planar conductor being extensive in a first plane and having first and second opposing planar surface;
   a circuit board with a wiring provided thereon for extracting a voltage signal from the conductor, the circuit board being extensive in a second plain perpendicular to the first plane, wherein the circuit board is attached to the second planar surface of the planar conductor so as to extend from the second planar surface in the second plane; and
   a case large enough to accommodate the circuit board inside of the case, the case having one face extensive along the first plane and formed with an opening, wherein the planar conductor is placed on the said one face of the case and closes the opening in such a manner that the second planar surface of the planar conductor faces the inside of the case and the circuit board extends inside the case along the second plane from the second planar surface.

2. The current measuring device according to claim 1, wherein the circuit board and the conductor are both formed in a rectangular shape, and the circuit board is attached to the conductor so that their length directions are parallel to each other.

3. The current measuring device according to claim 1, wherein the circuit board is attached within the second planar surface of the conductor.

4. The current measuring device according to claim 1, wherein the circuit board has electronic components mounted thereon, and the electronic components are disposed away from the conductor to lower heat influence from the conductor.

5. The current measuring device according to claim 4, wherein the electronic components comprises a temperature sensing element disposed near the conductor, and an electronic component for processing a sensed signal from the temperature sensing element, wherein the electronic component for processing a sensed signal from the temperature sensing element is disposed further away from the temperature sensing element, measured from the conductor.

6. The current measuring device according to claim 1, wherein the case has a length extending along the second plane that is equal to a length of the circuit hoard extending in the second plane.

* * * * *

UNITED STATES PATENT AND TRADEMARK OFFICE
CERTIFICATE OF CORRECTION

PATENT NO. : 11,268,986 B2
APPLICATION NO. : 16/334494
DATED : March 8, 2022
INVENTOR(S) : Tamotsu Endo It is certified that error appears in the above-identified patent and that said Letters Patent is hereby corrected as shown below:

In the Claims

In Column 8, Claim 5, Line 22, delete "comprises" and replace with --comprise--.

Signed and Sealed this
Eighteenth Day of July, 2023

Katherine Kelly Vidal
*Director of the United States Patent and Trademark Office*